(12) United States Patent
Peng et al.

(10) Patent No.: US 10,268,125 B2
(45) Date of Patent: Apr. 23, 2019

(54) DEVICE AND METHOD FOR DETECTING OVERLAY ERROR

(71) Applicant: SHANGHAI MICRO ELECTRONICS EQUIPMENT (GROUP) CO., LTD., Shanghai (CN)

(72) Inventors: Bofang Peng, Shanghai (CN); Hailiang Lu, Shanghai (CN); Fan Wang, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 15/541,342

(22) PCT Filed: Feb. 5, 2016

(86) PCT No.: PCT/CN2016/073630
§ 371 (c)(1),
(2) Date: Jun. 30, 2017

(87) PCT Pub. No.: WO2016/107614
PCT Pub. Date: Jul. 7, 2016

(65) Prior Publication Data
US 2017/0351184 A1  Dec. 7, 2017

(30) Foreign Application Priority Data

Dec. 31, 2014  (CN) .......................... 2014 1 0855716

(51) Int. Cl.
*G03F 7/20* (2006.01)
(52) U.S. Cl.
CPC ............................ *G03F 7/70633* (2013.01)

(58) Field of Classification Search
CPC .................................................. G03F 7/70633
See application file for complete search history.

(56) References Cited

U.S. PATENT DOCUMENTS

| | | | | |
|---|---|---|---|---|
| 2004/0129900 A1* | 7/2004 | Den Boef | ............. | G03F 9/7046 250/559.3 |
| 2013/0100427 A1* | 4/2013 | Koolen | ..................... | G03F 1/42 355/67 |

(Continued)

FOREIGN PATENT DOCUMENTS

| | | |
|---|---|---|
| CN | 1936711 A | 3/2007 |
| CN | 101435997 A | 5/2009 |

(Continued)

*Primary Examiner* — Michelle M Iacoletti
(74) *Attorney, Agent, or Firm* — Muncy, Geissler, Olds & Lowe, P.C.

(57) ABSTRACT

A device including a light source, illumination system, objective lens, and detector. The light source produces measurement light beams, the illumination system directs measurement light beams into the objective lens, and the objective lens directs measurement light beams onto an overlay marker, collects main maximums of diffracted light beam diffracted from the overlay marker, and focuses main maximums of diffracted light beam onto a pupil plane of the objective lens. The detector is positioned on the pupil plane of the objective lens and used for detecting the position of each main maximums of diffracted light beam on the detector, to obtain the overlay error of said overlay marker. Diffracted-light position information is used to measure overlay error, and measurement signals are not affected by illumination uniformity, transmissivity uniformity, etc.

16 Claims, 8 Drawing Sheets

(56) References Cited

U.S. PATENT DOCUMENTS

2014/0177044 A1  6/2014  Schwertner et al.
2014/0192338 A1  7/2014  Den Boef

FOREIGN PATENT DOCUMENTS

| CN | 103076724 A | 5/2013 |
|---|---|---|
| CN | 103293884 A | 9/2013 |
| CN | 103777467 A | 5/2014 |
| CN | 103969960 A | 8/2014 |
| JP | S58200104 A | 11/1983 |
| JP | 1991257303 A | 11/1991 |
| JP | 1997189520 A | 7/1997 |
| JP | 2004279405 A | 10/2004 |
| JP | 2005140743 A | 6/2005 |
| JP | 2010271186 A | 12/2010 |
| JP | 2010271188 A | 12/2010 |
| JP | 2013030757 A | 2/2013 |
| WO | WO-2015009739 A1 | 1/2015 |

\* cited by examiner

DEVICE AND METHOD FOR DETECTING OVERLAY ERROR

TECHNICAL FIELD

The present invention relates to the field of photolithography and, in particular, to an apparatus and method for overlay error detection.

BACKGROUND

With the critical dimensions (CDs) of photolithography patterns shrinking to 22 nm or less, especially with the increasingly extensive use of double patterning techniques, overlay measurement accuracy, as one metric measuring the performance of photolithography processes, is required to be on the order of sub-nanometers. Due to imaging resolution limits, traditional overlay measurement techniques based on imaging and image recognition (i.e., imaging-based overlay (IBO) techniques) have been increasingly important to meet the overlay measurement requirements of new technical nodes. Currently, overlay measurement techniques based on diffracted light detection (i.e., diffraction-based overlay (DBO) techniques) are increasingly prevalent in the field of overlay measurement. The greatest challenge faced by the existing DBO techniques is that the marks, which are large, take up an excessively large part of the effective exposure area, leading to excessive cost of the marks. In addition, in order to be in line with the overlay measurement requirements of new technical nodes, it is necessary to carry out the overlay measurement in the exposure field. However, large marks are not suitable for in-field measurement. Thus, scaling-down of overlay marks is an inevitable trend in the development of DBO techniques.

A DBO technique proposed in the prior art is to obtain an overlay error through measuring asymmetry between diffracted light components of the same order of diffraction in angular resolution spectra for an overlay mark. The angle at which incident light is diffracted varies with the incident light, and the so-called angular resolution spectra of diffracted light refer to strength distributions of light diffracted by the mark at different angles when light is incident on the mark at different angles. FIG. 1a shows an angular resolution spectra for different orders of diffraction (−2, −1, 0, 1, 2) formed on a CCD detector under an annular illumination condition. FIG. 1b is a structural schematic of an apparatus for this technical solution. Light emitted from a light source 2 is focused by a lens L2 and then shaped by an interference filter 30 into an incident light beam of a narrow bandwidth. An objective L1 then condenses the incident light onto an overlay mark in a substrate 6, wherein the overlay mark is typically consisted of two stacked linear gratings. In the figure, F denotes a focal length of the objective. An overlay mark detector 32 is arranged on a rear focal plane 40 of the objective L1, and diffracted light from the overlay mark is collected at the objective L1 and then reflected by a reflector surface 34 onto and received by the overlay mark detector 32. The overlay mark detector 32 measures angular resolution spectra of diffracted light from the overlay mark at different angles. In order to obtain angular resolution spectra over a large range, an objective with a large numerical aperture (NA) is adopted in the solution. As known from the above description, first, according to its measuring principles, the overlay mark has to assume a large size. In addition, it is not feasible to reduce the mark size through decreasing the size or number of pitches of the gratings. This is because with smaller pitches in the gratings, diffracted light of higher orders may become evanescent and cannot be collected, leading to non-detection of corresponding overlay signals, and when the number of pitches in the overlay mark is reduced to a certain value, diffracted light components of different orders will no longer strictly follow the grating diffraction equation, disabling the overlay error calculation based on the detected diffracted light signals. Therefore, this solution is incapable of in-field measurement using small marks. Additionally, in this solution, overlay information is obtained based on the detection of light strength signals for diffracted light, making the overlay measurement accuracy susceptible to system illumination uniformity and transmission uniformity.

SUMMARY OF THE INVENTION

It is an object of the present invention to provide an apparatus and method for overlay error detection, which are capable of overlay error measurement based on positional information of diffracted light.

In order to achieve the above object, an apparatus for overlay error detection according to the present invention comprises a light source, an illumination system, an objective lens and a detector. The light source is configured to producing a measuring light. The illumination system is configured to make the measuring light incident on the objective lens. The objective lens is configured to direct the measuring light onto an overlay mark, collect main maximums of diffracted light components diffracted from the overlay mark and concentrate the main maximums of the diffracted light components onto a pupil plane of the objective lens. The detector is arranged on the pupil plane of the objective lens and configured to detect positions of the main maximums of the diffracted light components on the detector so as to obtain an overlay error of the overlay mark.

Preferably, the illumination system comprises a collimator lens, a filter, a first lens, a field stop, a second lens and a splitter, disposed sequentially in a direction of propagation of the measuring light.

Preferably, the illumination system further comprises a polarizer disposed between the filter and the first lens.

Preferably, a number of pitches in the overlay mark is less than 20 and the overlay mark has a size less than or equal to 10 μm*10 μm.

Preferably, the illumination system comprises an aperture stop disposed between the filter and the first lens and is implemented as a circular hole or a slit.

Preferably, two circular holes or two slits are provided, and wherein the two circular holes or slits are symmetric to each other with respect to a center of the aperture stop.

Preferably, at least three circular holes or slits are provided.

Preferably, the main maximums of the diffracted light components are of plus and minus first orders.

Preferably, the overlay mark consists of two stacked gratings formed in a substrate.

The present invention also provides a method for overlay error detection, in which a light source produces a measuring light; an illumination system makes the measuring light incident on an objective lens; the objective lens directs the measuring light onto an overlay mark, collects main maximums of diffracted light components diffracted from the overlay mark and converges the main maximums of the diffracted light components onto a pupil plane of the objective lens; and a detector arranged on the pupil plane of the objective lens detects positions of the main maximums of the diffracted light components on the detector so as to obtain an overlay error of the overlay mark.

Preferably, a number of pitches in the overlay mark is less than 20 and the overlay mark has a size less than or equal to 10 μm*10 μm.

Preferably, the illumination system comprises an aperture stop which is implemented as a circular hole or a slit.

Preferably, two circular holes or two slits are provided, and wherein the two circular holes or slits are symmetric to each other with respect to a center of the aperture stop.

Preferably, at least three circular holes or slits are provided.

Preferably, the main maximums of the diffracted light components are of plus and minus first orders.

Preferably, the overlay error is obtained by performing a linear fitting on the positions of the main maximums of the diffracted light components on the detector.

Compared to the prior art, the present invention offers the following advantages:

1. It enables overlay error measurement based on positional information of diffracted light, eliminating the influence from illumination uniformity, transmission uniformity and the like.

2. Smaller measuring marks are allowed to be used which take up a smaller portion of the effective exposure area. As a result, the cost of the overlay marks and its adverse effect on chip fabrication are reduced.

3. Use of the smaller marks allows measurement within the exposure field, which is impossible for the prior art, meeting the higher requirements of new technical nodes on overlay error measurement accuracy.

DETAILED DESCRIPTION

The above objects, features and advantages of the present invention will be more apparent and readily understood from the following detailed description of several specific embodiments of the invention which are to be read in conjunction with the accompanying drawings. It is noted that the figures are provided in a very simplified form not necessarily presented to scale, with the only intention of facilitating convenience and clarity in explaining the embodiments.

Embodiment 1

Figure 1A:
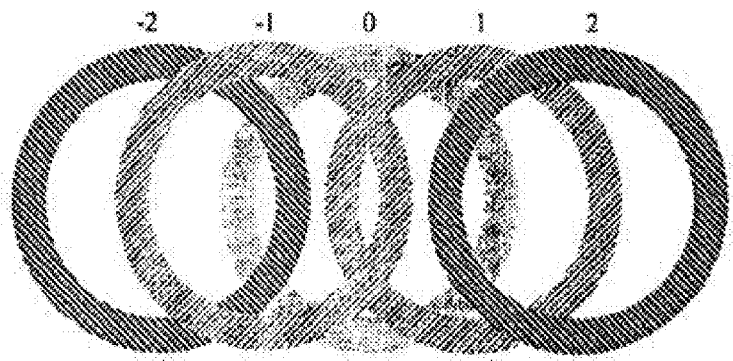
FIG. 1a shows a distribution of angular resolution spectra for different orders of diffraction on a CCD detector under an annular illumination condition.
Figure 1B:
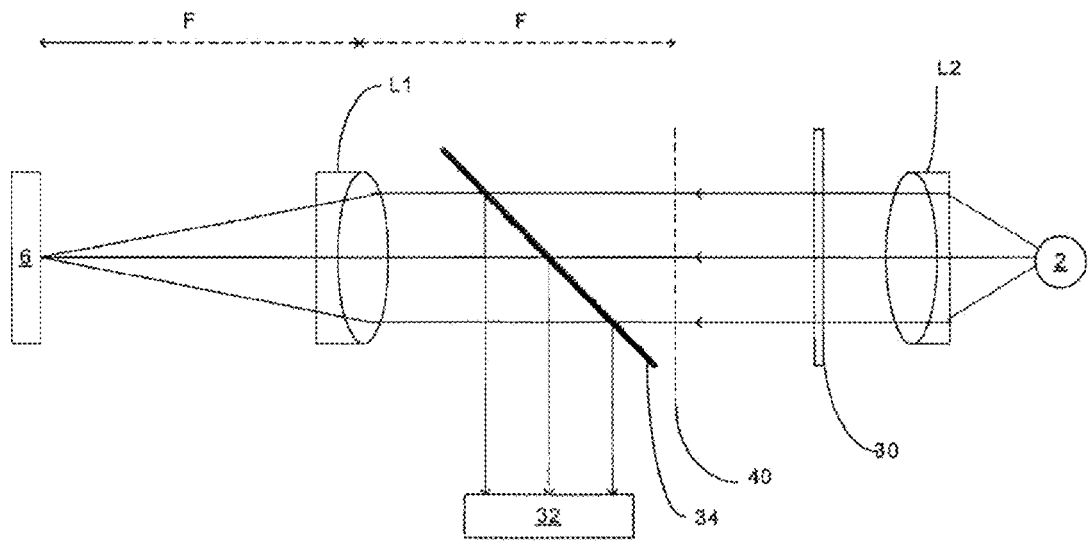
FIG. 1b is a structural schematic of an apparatus for a conventional DBO technique.
Figure 2:
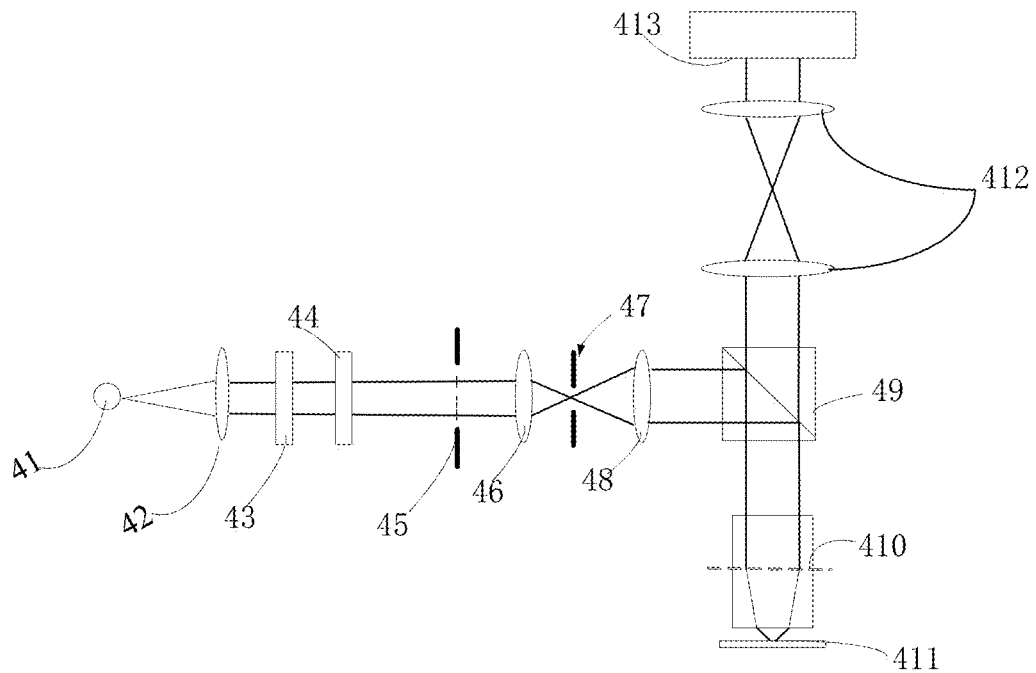
FIG. 2 is a structural schematic of an apparatus for overlay error detection according to a first embodiment of the present invention.

As shown in FIG. 2, an apparatus for overlay error detection includes the components as detailed below.

A light source 41 is configured to produce a measuring light. Specifically, the light source 41 may be a white light source, a wide-band light source or a composite light source consisting of a number of discrete spectral lines. The white light source may be implemented as a Xe light source or the like. The term "wide-band light" refers to light including components in the ultraviolet, visible or infrared band, or a combination thereof. The composite light source can be obtained through mixing light of different wavelengths emanated from a number of laser devices.

An illumination system is configured to render the measuring light incident on an objective 410. Specifically, the illumination system comprises, disposed sequentially along a direction of propagation of the light, a collimator lens 42 configured to collimate the measuring light, a filter 43 for producing monochromatic light, a polarizer 44 for generating polarized light, first and second lenses 46, 48 for light concentration and a splitter 49 for directing the measuring light to the objective 410. In addition, the illumination system may further include a lens group 412 disposed between the objective 410 and the detector 413.

Figure 7A:
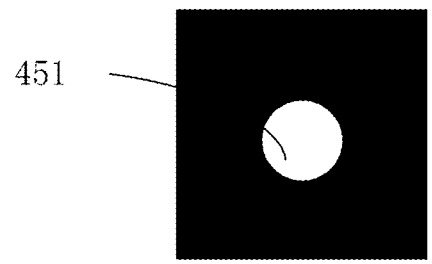
FIGS. 7a and 7b are structural schematics showing aperture stops in accordance with the first embodiment of the present invention.
Figure 9A:
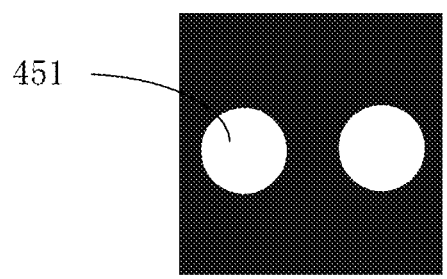
FIGS. 9a and 9b are structural schematics showing aperture stops in accordance with the first embodiment of the present invention.
Figure 9B:
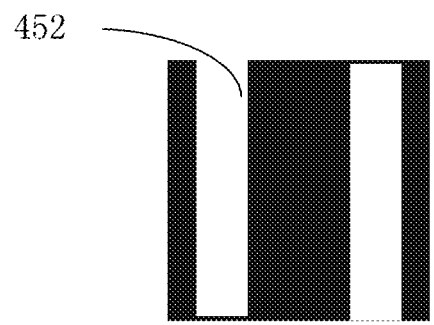
Figure 10A:
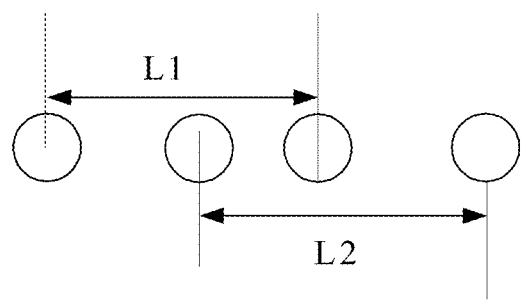
FIGS. 10a and 10b schematically depict diffracted light signals resulting from the respective aperture stops of FIGS. 9a and 9b.
Figure 10B:
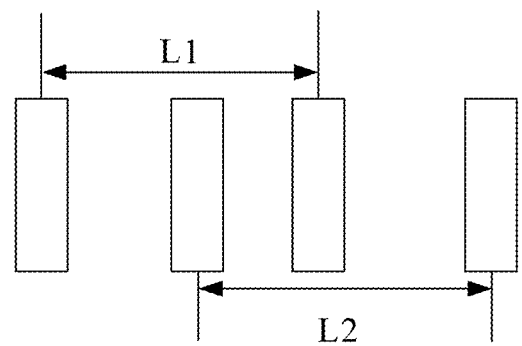

Stops are configured to modulate the measuring light into an incident light beam that is centrosymmetric with respect to an optical axis of the objective 410. Specifically, the stops include an aperture stop 45 and a field stop 47 configured to form a light spot satisfying the requirement of the objective 410 on the size of the incident light. The aperture stop 45 is disposed in front of the first lens 46, while the field stop 47 is arranged between the first lens 46 and the second lens 48. The aperture stop 45, such as a circular hole 451 shown in FIG. 7a or a slit 452 shown in 7b, is configured to form a light spot satisfying the requirement of the objective 410 on the shape of the incident light. Alternatively, two circular holes 451 as shown in FIG. 9a or two slits 452 as shown in FIG. 9b, which are in symmetry with respect to a center of the aperture stop 45, may be provided.

The objective 410 is configured to direct the measuring light onto an overlay mark 411 so that the measuring light is diffracted by the overlay mark 411. Additionally, the objective 410 collects diffracted light components from the overlay mark 411, especially main maximums of different orders, and converges them onto a pupil plane of the objective 410.

A detector 413 is arranged on the pupil plane of the objective 410, which is also a rear focal plane of the objective 410, in order to detect signals on the diffracted light components from the overlay mark 411.

The measuring light from the light source 41 is collimated by the collimator lens 42 and then shaped to light of a single wavelength by the narrow-band filter 43. Subsequently, it is converted by the polarizer 44 into linearly polarized light. This polarized light passes through the aperture stop 45 and is then concentrated by the first lens 46. Afterward, it is restricted by the field stop 47 so that a desirably-sized light spot will be formed on the overlay mark 411. After that, it transmits through the second lens 48 and is then incident on the splitter 49. The light exiting from the splitter 49 then concentrically passes through the objective 410 and is then diffracted by the overlay mark 411. The diffracted light components pass through the objective 410, then the lens group 412 and finally reach the detector 413.

Figure 7B:
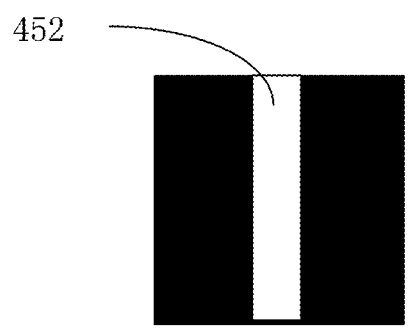
Figure 8A:
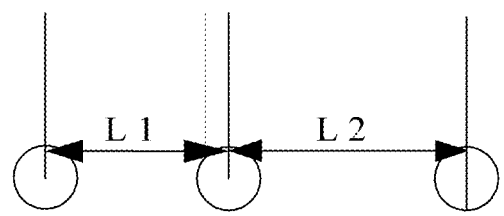
FIGS. 8a and 8b schematically depict diffracted light signals resulting from the respective aperture stops of FIGS. 7a and 7b.
Figure 8B:
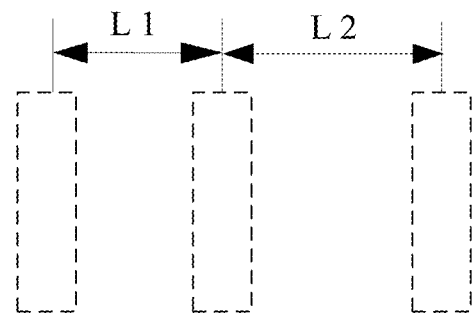

Signals detected by the detector 413 representing the diffracted light components of the ±1st orders are respectively shown in FIGS. 8a and 8b and FIGS. 10a and 10b. The signal of FIG. 8a corresponds to the aperture stop 45 of FIG. 7a, and the signal of FIG. 8b to the aperture stop 45 of FIG. 7b. The signal of FIG. 10a corresponds to the aperture stop 45 of FIG. 9a, and the signal of FIG. 10b to the aperture stop 45 of FIG. 9b. In the figures, L1 and L2 are different from each other, and an overlay error of the overlay mark 411 can be calculated based on a correlation between them. The calculation will be described in further detail below. Apart from those of the ±1st orders, main maximums of diffracted light components of other higher orders may be similarly calculated and serve as the basis for overlay error calculation.

Figure 3:
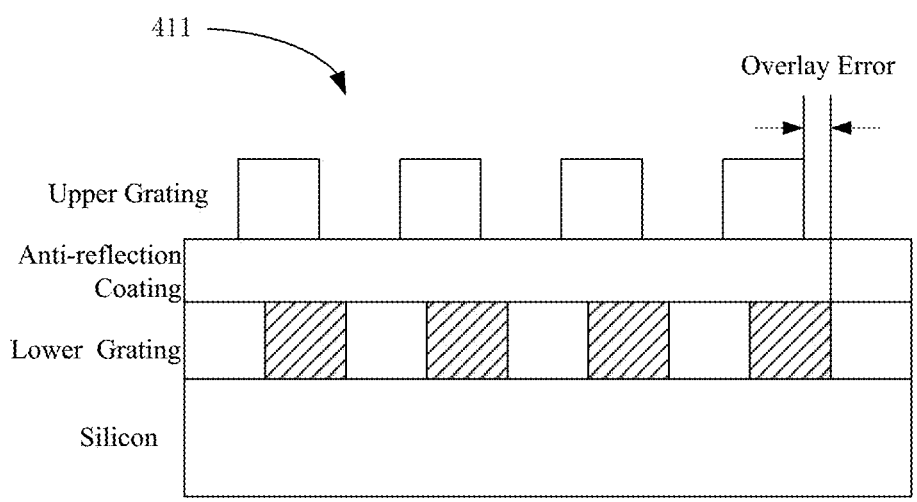
FIG. 3 is a structural schematic of an overlay mark according to the first embodiment of the present invention.

As shown in FIG. 3, the overlay mark 411 consists of two stacked gratings formed in a silicon substrate. The front (lower) grating is formed by subjecting a previously exposed pattern to developing, etching, depositing and other semiconductor processes, while the rear (upper) grating is a photoresist pattern formed by later exposure and developing processes. The overlay error refers to a positional error between the two exposure processes. When there are an adequate number of pitches in the gratings, the diffracted light will typically follow the grating diffraction equation.

For the diffracted light components of the ±1$^{st}$ orders used in the current scattered light measurements, there is:

$$\sin(\theta) = \pm \lambda/d \quad (1)$$

In Equation (1), d denotes the grating pitch, λ represents a wavelength of the incident light, and θ is an angle of diffraction. The diffracted light components are incident on the objective 410 at the corresponding angles of diffraction θ.

Therefore, for the objective lens 410 that complies with the Abbe imaging theory, the radius ρ of the pupil plane and the angle of diffraction θ satisfy:

$$\rho = f^* \sin(\theta) \quad (2)$$

In Equation (2), f denotes a focal length of the objective, and θ is the angle of diffraction and also the angle at which the diffracted light is incident on the pupil plane. Therefore, the radius of the pupil plane is proportional to the sine of the maximum angle of incidence (i.e., the objective's numeral aperture).

Figure 4:
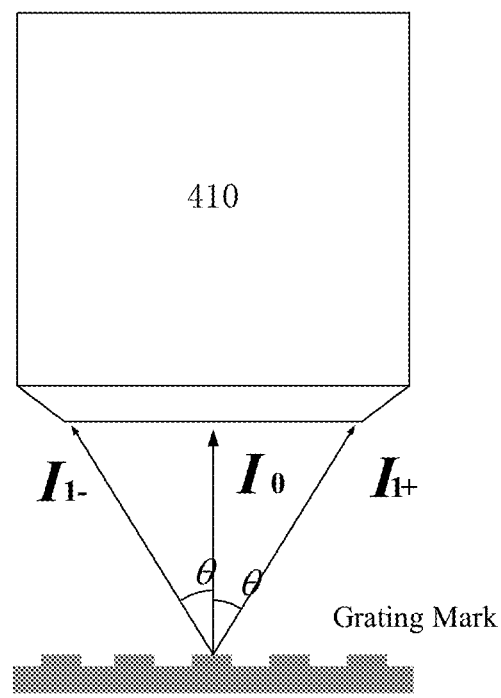
FIGS. 4 and 5 are schematic illustrating diffraction occurring in accordance with the first embodiment of the present invention.
Figure 5:
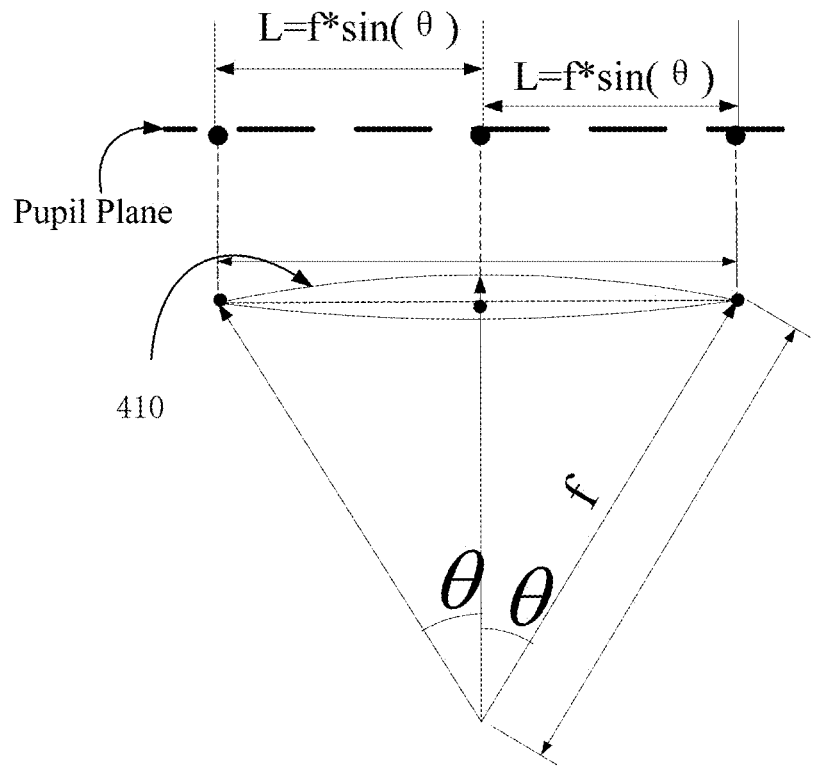

After being collected by the objective 410, as shown in FIGS. 4 and 5, the diffracted light components of the ±1$^{st}$ orders will have the same distance from their positions in the pupil plane to a center of the pupil plane, and the distance can be described as $$L = f^* \sin(\theta) \quad (3)$$

Therefore, the light components of different orders with corresponding angles of diffraction can be faithfully reflected on the pupil plane and collected by the CCD detector.

When there are an inadequate number of pitches in the gratings, the angles of diffraction of main maximums of diffracted light components may no longer strictly follow the grating diffraction equation. In this case, for the overlay mark 411, preferably, when the number of pitches in the gratings is equal to or less than 20, the angles of diffraction of the various main maximums (corresponding to the positions of the different main maximums on the pupil plane) will vary with the overlay error. As shown in FIGS. 8a, 8b, 10a and 10b, L1 is not equal to L2. That is, due to existence of the overlay error, the positions of the main maximums of the diffracted light component of the ±1st orders on the pupil plane (detector) are not equidistant from the center of the pupil plane. According to this embodiment, overlay error measurement is enabled based on such dependence. In particular, in a specific diaphragm system, when the overlay error varies over a certain range, the angles of diffraction of plus and minus main maximums (their peak values) vary accordingly. Based on linear dependence of the angles of diffraction of main maximums (also their positions) on the overlay error or other correlations therebetween that can be obtained by fitting (e.g., linear fitting, trigonometric fitting or the like), the overlay error is measurable. As the number of pitches in the gratings is reduced, the overlay mark may be made smaller, for example, with a size in the range of no larger than 10 μm*10 μm.

In order to eliminate the influence of other factors, a relationship between the difference between the plus and minus main maximums and the overlay error can be used. A linear fitting method used in the overlay error detection is explained below by the way of example.

Figure 6:
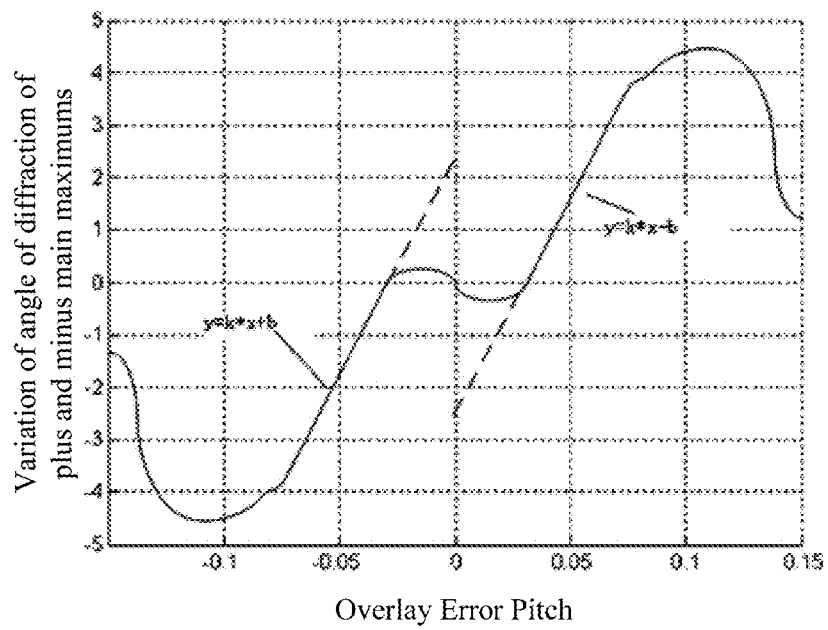
FIG. 6 schematically illustrates variation of a signal indicative of the difference between plus and minus main maximums with the overlay error in accordance with the first embodiment of the present invention.

As shown in FIG. 6, when the overlay error is about ±0.05*pitch (i.e., the distance between adjacent slits in the gratings), the angle of diffraction of the main maximums varies linearly with the overlay error, and the overlay error can be calculated by performing linear fitting on this relationship. Specifically, the overlay error measurement can be accomplished using three overlay marks each with a predefined deviation. The three overlay marks are so arranged that the first overlay mark is located between the second and third overlay marks. The predefined deviation d of the first overlay mark is d=0.05*pitch, the difference between the the second overlay mark and the first overlay mark is $d_0$=0.01*pitch and the predefined deviation of the third overlay mark is opposite in direction but the same in magnitude to that of the first overlay mark, i.e., −d. Assuming the overlay error to be actually measured is ε, then the actual deviations between the respective upper and lower gratings of overlay marks are d+ε−$d_0$, d+ε and −d+ε. If a linear equation used to measure the overlay error based on these three points is:

$$y = k^*x \pm b \quad (4)$$

When substituting the data of the three overlay marks into equation (4), we can obtain:

$$\begin{cases} y_1 = k*(d + \varepsilon - d_0) + b \\ y_2 = k*(d + \varepsilon) + b \\ y_3 = k*(-d + \varepsilon) - b \end{cases} \quad (5)$$

From equation (5), it is easy to calculate the overlay error ε as:

$$\varepsilon = d_0 * \frac{y_2 + y_3}{2(y_1 - y_2)} \quad (6)$$

Embodiment 2

Figure 11:
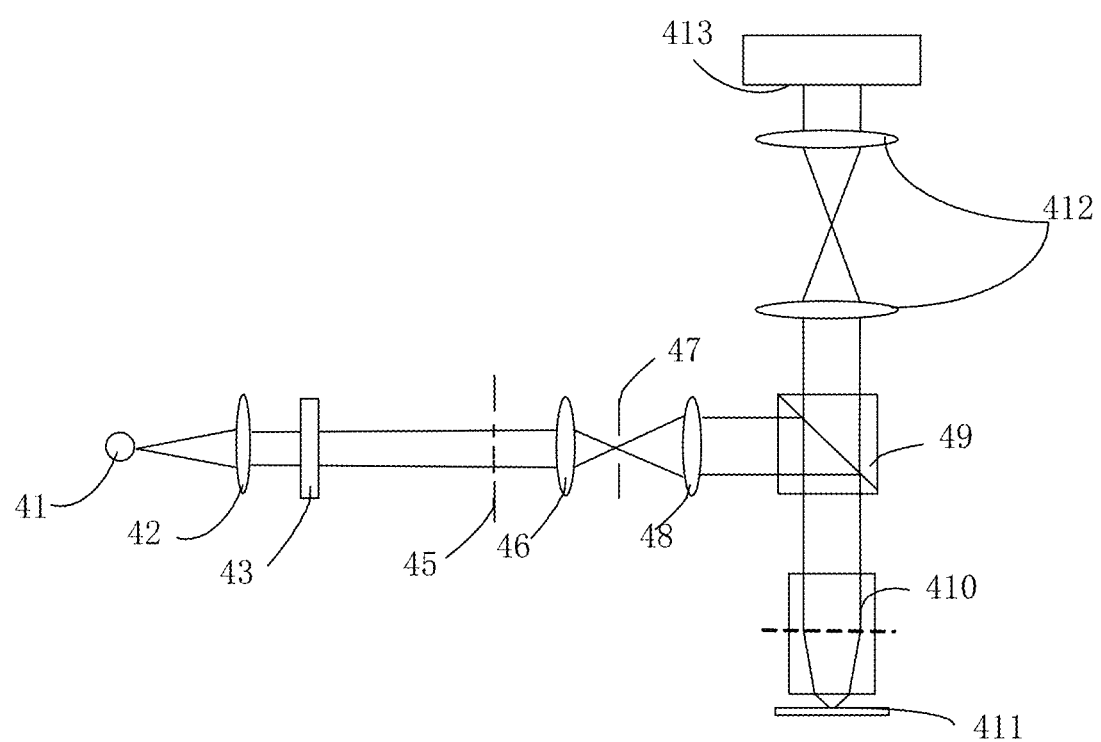
FIG. 11 is a structural schematic of an apparatus for overlay error detection according to a second embodiment of the present invention.

As shown in FIG. 11, this embodiment is essentially the same as Embodiment 1 except that the polarizer 44 is not included. That is, the polarizer is not necessarily required, and overlay signals for the two different aperture stops 45 can still be obtained and serve as the basis for overlay error calculation even when without the polarizer.

Compared to the prior art, the present invention offers the following advantages:

1. It entails the overlay error measurement based on positional information of diffracted light, eliminating the influence from illumination uniformity, transmission uniformity and the like.

2. Smaller measuring marks are allowed to be used which take up a smaller portion of the effective exposure area. As a result, the cost of the overlay marks and its adverse effect on chip fabrication are reduced.

3. Use of the smaller marks allows measurement within the exposure field, which is impossible for the prior art, meeting the higher requirements of new technical nodes on overlay error measurement accuracy.

Apparently, those skilled in the art can make various changes and modifications to the present invention without departing from the spirit and scope thereof. Accordingly, it is intended that present invention includes these changes and modifications if they fall within the scope of the appended claims and the equivalents thereof.

What is claimed is:

1. An apparatus for overlay error detection, comprising a light source, an illumination system, an objective lens and a detector, wherein: the light source is configured to produce a measuring light; the illumination system is configured to make the measuring light incident on the objective lens; the objective lens is configured to direct the measuring light onto an overlay mark, collect main maximums of diffracted light components diffracted from the overlay mark and converge the main maximums of the diffracted light components onto a pupil plane of the objective lens; and the detector is arranged on the pupil plane of the objective lens and configured to measure positions of the main maximums of the diffracted light components on the detector and obtain an overlay error of the overlay mark based on a dependence of the positions of the main maximums of the diffracted light components on the pupil plane of the objective lens on the overlay error, wherein a number of pitches in the overlay mark is less than 20.

2. The apparatus for overlay error detection according to claim 1, wherein the illumination system comprises a collimator lens, a filter, a first lens, a field stop, a second lens and a splitter, disposed sequentially in a direction of propagation of the measuring light.

3. The apparatus for overlay error detection according to claim 2, wherein the illumination system further comprises a polarizer disposed between the filter and the first lens.

4. The apparatus for overlay error detection according to claim 2, wherein the illumination system comprises an aperture stop disposed between the filter and the first lens, and wherein the aperture stop is implemented as a circular hole or a slit.

5. The apparatus for overlay error detection according to claim 4, wherein two circular holes or two slits are provided, and wherein the two circular holes or slits are symmetric to each other with respect to a center of the aperture stop.

6. The apparatus for overlay error detection according to claim 4, wherein at least three circular holes or slits are provided.

7. The apparatus for overlay error detection according to claim 1, wherein the overlay mark has a size less than or equal to 10 µm*10 µm.

8. The apparatus for overlay error detection according to claim 1, wherein the main maximums of the diffracted light components are of plus and minus first orders.

9. The apparatus for overlay error detection according to claim 1, wherein the overlay mark consists of two stacked gratings formed in a substrate.

10. A method for overlay error detection using the apparatus for overlay error detection as defined in claim 1, wherein: a light source produces a measuring light; an illumination system makes the measuring light incident on an objective lens; the objective lens directs the measuring light onto an overlay mark, collects main maximums of diffracted light components diffracted from the overlay mark and converges the main maximums of the diffracted light components onto a pupil plane of the objective lens; and a detector arranged on the pupil plane of the objective lens measures positions of the main maximums of the diffracted light components on the detector and obtains an overlay error of the overlay mark based on a dependence of the positions of the main maximums of the diffracted light components on the pupil plane of the objective lens on the overlay error, wherein a number of pitches in the overlay mark is less than 20.

11. The method for overlay error detection according to claim 10, wherein the overlay mark has a size less than or equal to 10 µm*10 µm.

12. The method for overlay error detection according to claim 10, wherein the illumination system comprises an aperture stop which is implemented as a circular hole or a slit.

13. The method for overlay error detection according to claim 12, wherein two circular holes or two slits are provided, and wherein the two circular holes or slits are symmetric to each other with respect to a center of the aperture stop.

14. The method for overlay error detection according to claim 12, wherein at least three circular holes or slits are provided.

15. The method for overlay error detection according to claim 10, wherein the main maximums of the diffracted light components are of plus and minus first orders.

16. The method for overlay error detection according to claim 10, wherein the overlay error is obtained by performing a linear fitting on the positions of the main maximums of the diffracted light components on the detector.

* * * * *